(12) United States Patent
Margolin

(10) Patent No.: US 7,360,130 B2
(45) Date of Patent: Apr. 15, 2008

(54) MEMORY WITH INTEGRATED PROGRAMMABLE CONTROLLER

(76) Inventor: Jed Margolin, 3570 Pleasant Echo Dr., San Jose, CA (US) 95148-1916

( * ) Notice: Subject to any disclaimer, the term of this patent is extended or adjusted under 35 U.S.C. 154(b) by 343 days.

(21) Appl. No.: 11/130,939

(22) Filed: May 17, 2005

(65) Prior Publication Data

US 2005/0258456 A1 Nov. 24, 2005

Related U.S. Application Data

(60) Provisional application No. 60/573,964, filed on May 24, 2004.

(51) Int. Cl.
G11C 29/00 (2006.01)

(52) U.S. Cl. .................... 714/718; 714/763

(58) Field of Classification Search ............. None
See application file for complete search history.

(56) References Cited

U.S. PATENT DOCUMENTS

| | | | |
|---|---|---|---|
| 4,168,796 A * | 9/1979 | Fulks et al. ............. 714/734 |
| 4,194,113 A * | 3/1980 | Fulks et al. ............. 714/732 |
| 4,498,155 A | 2/1985 | Rao | |
| 4,757,503 A | 7/1988 | Hayes et al. | |
| 5,461,328 A | 10/1995 | Devereaux et al. | |
| 5,553,229 A | 9/1996 | Margolin | |
| 5,766,979 A | 6/1998 | Budnaitis | |
| 5,819,087 A * | 10/1998 | Le et al. ............. 713/2 |
| 6,020,750 A | 2/2000 | Berger et al. | |
| 6,035,380 A * | 3/2000 | Shelton et al. ............. 711/163 |
| 6,154,861 A | 11/2000 | Harward | |
| 7,155,637 B2 * | 12/2006 | Jarboe et al. ............. 714/8 |
| 2006/0273809 A1 * | 12/2006 | Miller et al. ............. 324/754 |

* cited by examiner

Primary Examiner—Phung My Chung (57) ABSTRACT

An internal processing capability is added to a computer memory by adding a small processor, a small amount of processor RAM memory, a small amount of non-volatile memory, and some logic. During wafer testing the internal processor system allows the memory to be tested at full speed and substantially simultaneously with the testing of other memories on the wafer. At any stage after packaging, the part can be tested by having the host processor read the non-volatile memory, determine what test program to use, load it into the RAM memory, and run the Self-Test program. The internal processor system also allows additional functions such as data searching, data moving, and graphics primitives to be performed entirely within the memory.

8 Claims, 6 Drawing Sheets

MEMORY WITH INTEGRATED PROGRAMMABLE CONTROLLER

CROSS REFERENCES TO RELATED APPLICATIONS

This application claims the benefit of U.S. Provisional Application No. 60/573,964 filed on May 24, 2004.

BACKGROUND OF THE INVENTION

1. Field of Invention

This invention relates to a controller integrated within a computer memory which is used for memory testing during wafer testing and for performing additional useful functions when installed in a User's system. For the purposes of this application the terms Controller and Processor will mean the same thing and the Test CPU (TCPU) is a Processor. The term User includes the end user of the memory such as when the memory is installed in a Personal Computer or other device.

2. Background of the Invention

Typically, in addition to hard errors such as stuck nodes, memories are subject to errors caused by a sensitivity to the pattern of data stored in the memory. It is not feasible to test every combination of data bits in a large memory because it would simply take too long. Therefore, patterns are selected that are either predicted or known to cause errors. Pattern sensitivities can change as processes are changed; thus it may be necessary to change the test suite as wafers are processed. It is also possible that new pattern sensitivities may be discovered after a part is installed in a User's system. When this new pattern is added to the test suite the yield goes down. To bring the yield back up the process is tweaked and/or the part is redesigned.

In the manufacturing process, after a wafer is fabricated the common practice is to test each IC by positioning a test head containing probes over each IC one at a time to contact the IC's pads, exercise the IC to determine whether it is good, and mark the bad ones. After all the ICs on the wafer are tested they are cut from the wafer and the good ones are packaged. These are then tested again. By testing the ICs before they are cut from the wafer the bad ones can be discarded before they are packaged, thus saving money. However, as ICs become more complex, the time needed to test them increases. This is especially true with memories because of the need to test for memory sensitivity to data patterns. ICs are also commonly tested at different speeds because memories that fail at the highest rated speed may perform properly at lower speeds. Good memories are then sorted by speed so the lower speed devices can be sold instead of thrown away. Another problem faced by memory manufacturers is that as ICs become faster it becomes more difficult to test them at their rated speed due to the limitations imposed by using a test head.

Another common practice (called burn-in) is to subject the wafer to elevated temperatures. Premature IC failure tends to occur early in an IC's expected operating life. Subjecting the wafer to elevated temperatures accelerates the early-failure rate of the ICs.

Burn-in is more effective if the ICs on the wafer are powered during the test. One method to accomplish this is taught in U.S. Pat. No. 5,461,328 Fixture for burn-in testing of semiconductor wafers issued Oct. 24, 1995, to Devereaux, et al. Another method is taught in U.S. Pat. No. 5,766,979 Wafer level contact sheet and method of assembly issued Jun. 16, 1998, to Budnaitis. A further method is taught in U.S. Pat. No. 6,020,750 Wafer test and burn-in platform using ceramic tile supports issued Feb. 1, 2000, to Berger, et al.

However, these methods only apply power to the ICs on the wafer. They do not allow the ICs to be tested during burn-in. Some ICs may work perfectly well at room temperature and after burn-in but fail to work properly at the elevated temperature experienced during burn-in. Other ICs may work at room temperature, after burn-in, and at the elevated temperature, but fail to work at temperatures between room temperature and the elevated temperature. Since ICs are also rated to operate at a minimum temperature the same problem exists when testing these ICs at this low temperature. Some ICs may work at room temperature and low temperature but fail to work properly at intermediate temperatures.

Therefore a need exists to be able to continuously test ICs at the wafer level during testing, whether at elevated temperatures, low temperatures, or temperatures in-between, and keep a record of the results so that only good devices are packaged and sold to customers.

U.S. Pat. No. 4,757,503 Self-testing dynamic ram issued Jul. 12, 1988 to Hayes, et al. contains a built-in testing circuit using hard-wired logic. Changing the test suite requires redesigning the IC.

U.S. Pat. No. 6,154,861 Method and apparatus for built-in self-test of smart memories issued Nov. 28, 2000, to Harward contains a Test Controller (FIG. 4), the details of which are not disclosed. There is no suggestion that the Test Controller can be reprogrammed after the IC is fabricated. Likewise, there is no suggestion that the Test Controller can be used for other than memory testing.

Accordingly, one of the objects and advantages of the present invention is to provide a programmable processor integrated into the memory for efficiently testing memories during both wafer testing and after packaging. An additional object and advantage is to provide a programmable processor integrated into the memory that can be used for functions such as graphics primitives and data matching. Further objects and advantages of my invention will become apparent from a consideration of the drawings and ensuing description.

SUMMARY OF THE INVENTION

An internal programmable processor is added to a computer memory by adding a small processor, a small amount of processor RAM memory, a small amount of non-volatile memory, and some logic. During wafer testing and after the memory is packaged this internal processor can be used for memory testing. A programmable clock allows the memory to be tested at different speeds. After the memory is installed in a User's system, the programmable processor can also be used to perform useful functions such as data pattern matching, moving data, and graphics primitives such as clearing and setting memory and for drawing lines. Additional functions, such as data encryption and decryption can be implemented. When used in dynamic memory the processor can be used to perform self-refresh. These additional functions can be used to justify the slightly added complexity of the memory.

The present invention is to be distinguished from a standard microcontroller. A standard microcontroller is generally intended for use as a standalone system, contains a limited amount of internal memory, and does not provide direct access to its internal memory by a host system. The present invention is primarily a memory to be used with a host processor, such as for main system memory. The internal programmable processor is intended to facilitate memory testing during and after wafer fabrication and to provide additional functionality in a User's system.

During wafer testing the internal processor allows the memory to be tested at full speed and substantially simultaneously with the testing of other memories on the wafer. During wafer testing, the test head loads the test program into the processor RAM and starts the test program. It then moves on to the next memory on the wafer. After thus starting all the memories on the wafer it goes back to the first memory, and if necessary, waits for the test to finish.

If the memory fails the test it is marked as bad and the tester goes to the next memory. If the memory passes the test, the tester writes information into the non-volatile memory such as:

1. Manufacturer's identification code;
2. Part Number;
3. Part Serial Number;
4. Memory Algorithm number;
5. Maximum clock speed for proper performance.

The results from the remaining memories are then available in the order that the memories were loaded with the test program and the program started.

After a memory is packaged, the non-volatile memory cannot be written to, only read. This is to prevent unscrupulous vendors from remarking bad parts as good or improperly increasing the speed rating.

At any stage after packaging, the part can be tested by having the host processor read the non-volatile memory, determine what test program to use, load it into the processor RAM memory, and start the self-test processor. The internal Self-Test allows the memory to be tested at full speed and in parallel with other host system operations, such as the testing of other main memory.

Since the test program is RAM-based it can be changed without changing a mask, such as would be necessary if it were in masked ROM. This is advantageous because, other than hard errors such as permanently stuck bits, the main problem with large memories is pattern sensitivity. It is not feasible to test every combination of data bits in a large memory because it would simply take too long. Therefore, patterns are selected that are either predicted or known to cause errors. Pattern sensitivities can change as processes are changed; thus it may be necessary to change the test suite as wafers are processed. It is also possible that new pattern sensitivities may be discovered after a part is shipped to the user. By having a RAM-based test program the manufacturer is able to distribute new test programs for the life of the part.

An additional advantage is that since the information in the non-volatile memory contains a unique serial number that can be read by the host processor in any system using this part, by keeping track of serial numbers the parts that are identified as having been stolen can readily be identified.

If desired, manufacturers can publish the serial numbers of parts known to have been stolen and make this information available through a public network like the Internet. The appropriate software can then automatically determine if a user's memory is on this list.

Since all memory serial numbers are unique, the serial number will also uniquely identify all boards and systems that incorporate it.

DETAILED DESCRIPTION

In the following description, numerous specific details are set forth to provide a thorough understanding of the invention. However, it is understood that the invention may be practiced without these specific details. In other instances, well-known circuits, structures and techniques have not been shown in detail in order not to obscure the invention.

In the following discussion it should be noted that while conventional Dynamic RAMs (DRAMs) generally use a multiplexed address bus and conventional Static RAMs (SRAMs) generally use a non-multiplexed address bus, these are design choices made for various reasons (including tradition) that are not dictated by the technology itself. A DRAM can be made using a non-multiplexed address bus and an SRAM can be made using a multiplexed address bus. Memories which provide a serial interface for access by the User's system may also be practiced with the present invention.

Figure 1:
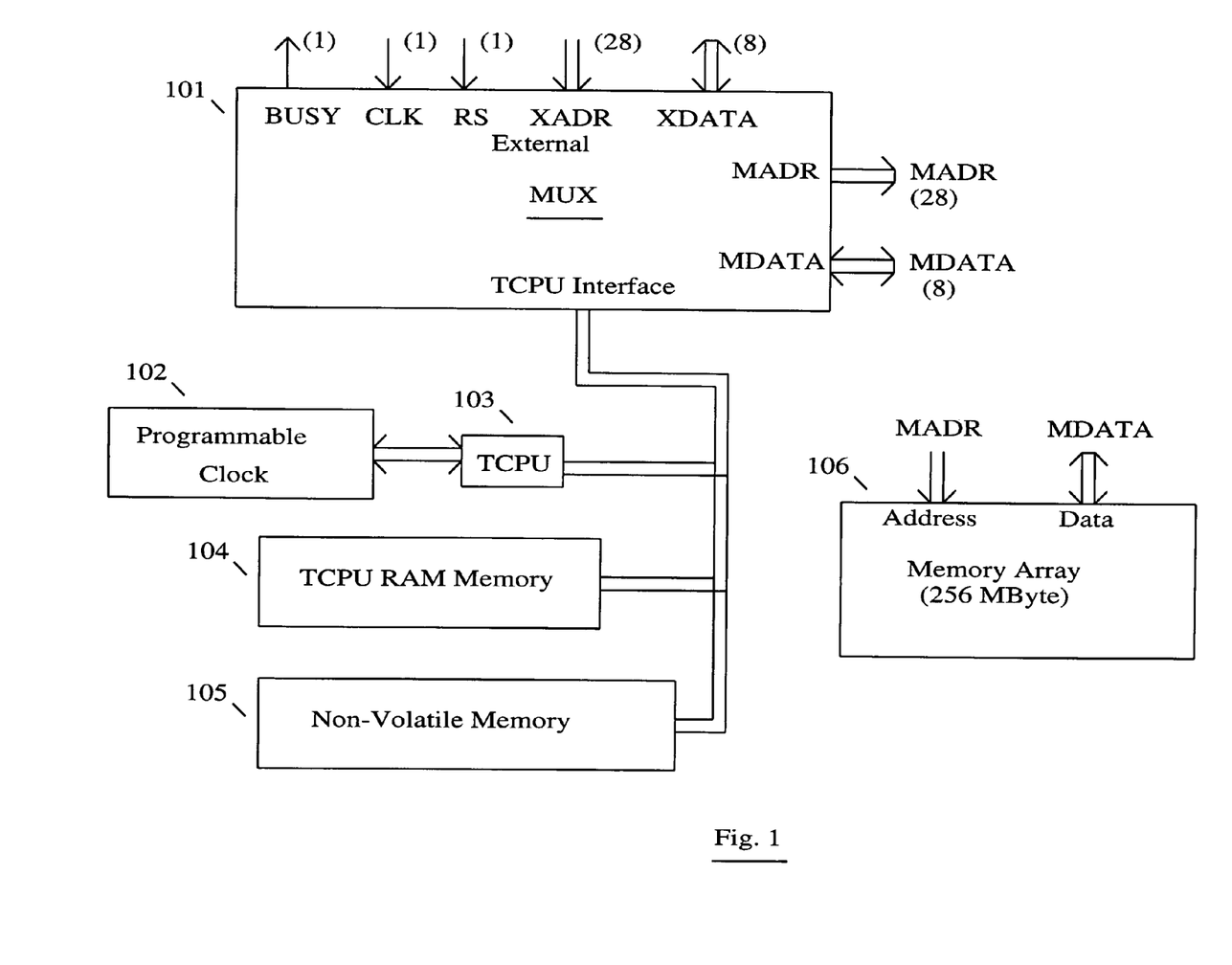
FIG. 1 shows the integrated processor system with a programmable clock in a memory with non-multiplexed address inputs.

Referring to FIG. 1, Memory Array 106 may take several forms. It may be a conventional read/write memory comprising row and address decoders, a memory cell array, and sense amplifiers. The memory cell array may be dynamic or static. Memory Array 106 may also contain a shift register, making it particularly suitable for shifting data out of the array to be displayed on a video monitor. An example of this type of memory, commonly called a Video RAM (VRAM) is taught in U.S. Pat. No. 4,498,155 Semiconductor Integrated circuit memory device with both serial and random access arrays issued Feb. 5, 1985, to Mohan Rao. A further example of a memory optimized for video operations is U.S. Pat. No. 5,553,229 Row addressable graphics memory with flash fill issued Sep. 3, 1996, to the present inventor. However, Memory Array 106 may also be Read-Only (ROM), Write Once, or Read-Mostly (such as Flash Memory). The design of the preceding memory arrays are well known to those skilled in the art of memory design.

Again referring to FIG. 1, the invention's internal programmable processing system is made up of processor TCPU 103, TCPU RAM Memory 104, Non-Volatile Memory 105, and Programmable Clock 102.

TCPU 103 (Test CPU) may use a Reduced Instruction Set (RISC) or a Complex Instruction Set (CISC), and may use a standard von Neumann architecture, a Harvard Architecture, a Very Long Instruction Word (VLIW) architecture, or a variation of architectures. The instruction set and architecture may be optimized for the tasks it is designed to perform.

TCPU RAM Memory 104 is used by TCPU 103 for storing instructions and data. It may have a single partition such as that required by a von Neumann architecture or it may be partitioned for use in a Harvard Architecture or the like. TCPU RAM Memory 104 may be static memory or dynamic memory but, due to its ease of use, static memory is preferred.

Non-Volatile Memory 105 is a non-volatile memory used for storing information such as: Manufacturer's identification code, Part Number, Part Serial Number, Memory Algorithm number, and Maximum clock speed for proper performance.

Programmable Clock 102 allows TCPU 103 to test the memory at different speeds as part of the manufacturing test protocol. Programmable Clock 102 may use a number of techniques to accomplish this, such as a Phase-Locked-Loop (PLL), a programmable divider, or Direct Digital Synthesis (DDS). Programmable Clock 102 normally powers-up at its minimum speed. Programmable Clock 102 may use the CLOCK input to MUX 101 as a reference or may contain an on-chip oscillator.

The bus comprising the TCPU Interface connects TCPU 103, TCPU RAM Memory 104, Non-Volatile Memory 105, and MUX 101 and contains data, address, and control signals.

Multiplexor MUX 101 controls and arbitrates access between the internal programmable processor, Memory Array 106, and the User's system. It allows TCPU 103 to access Memory Array 106. It also allows Memory Array 106 to be accessed by external buses such as when the invention is used as main memory in a User's system. In addition, through the use of the RS input on MUX 101, MUX 101 allows the User's system to control TCPU 103, access TCPU RAM Memory 104 in order to load the program to be run by TCPU 103, and access Non-Volatile Memory 105. The BUSY output on MUX 101 tells the User's system that Memory Array 106 is being used by TCPU 103 and to wait. The TCPU Interface contains a similar signal to tell TCPU 103 that Memory Array 106 is being used by the User's system and to wait. The preferred memory arbitration scheme is to give the User's system priority to Memory Array 106. If TCPU 103 is accessing Memory Array 106 at the beginning of a User system access, the User system waits until the next memory cycle at which point TCPU 103 is stalled and the User system gets access to Memory Array 106. The CLOCK input to MUX 101 is used by TCPU 103 when the invention is used by a User's system in order to avoid the potential for conflicts caused by metastable instability of an arbitration logic circuit that would exist if TCPU 103 used a clock having a frequency not synchronized to the clock used by the User's system. During Wafer testing, the CLOCK input to MUX 101 may be used as a reference by Programmable Clock 102. In FIG. 1, MUX 101 provides external access to Memory Array 106 through a non-multiplexed address bus.

Figure 2:
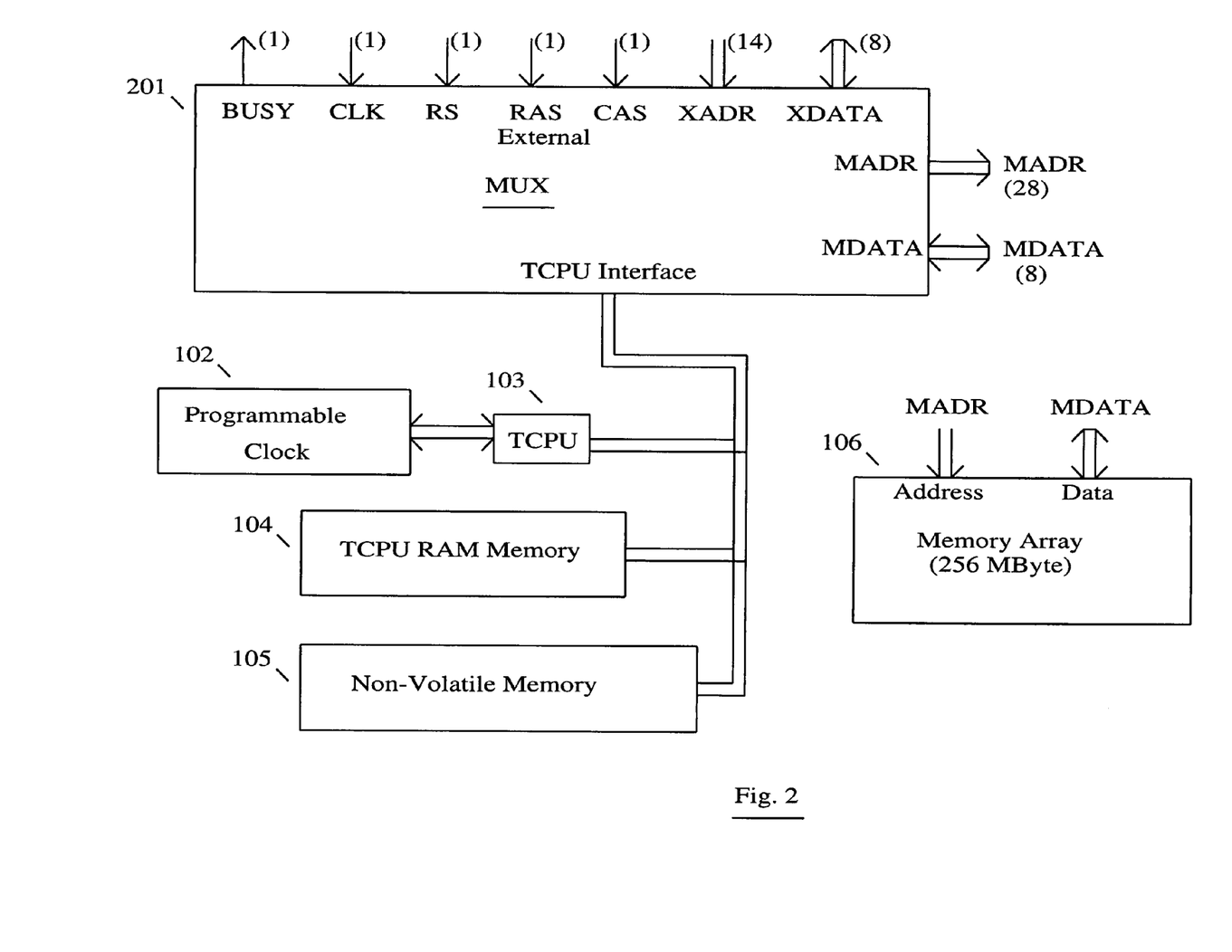
FIG. 2 shows the integrated processor system with a programmable clock in a memory with multiplexed address inputs.

FIG. 2 shows an embodiment that is identical to that shown in FIG. 1 except that MUX 201 provides external access to Memory Array 106 through a multiplexed address bus. TCPU 103 accesses Memory Array 106 before the addresses are multiplexed, thus avoiding the speed penalty incurred by multiplexing the address bus.

Figure 3:
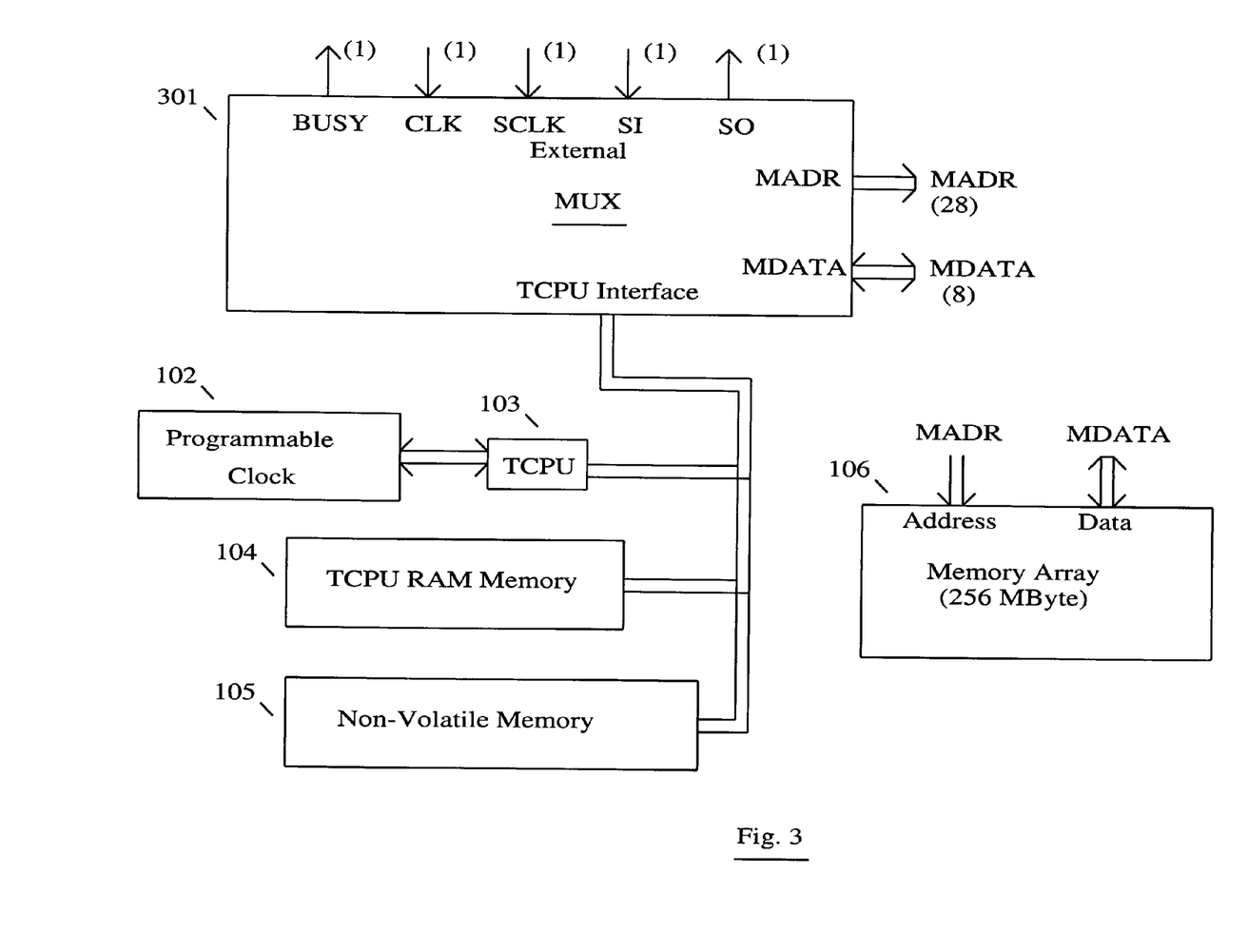
FIG. 3 shows the integrated processor system with a programmable clock in a memory with a serial interface.

FIG. 3 shows an embodiment that is identical to that shown in FIG. 1 except that MUX 301 provides external access to Memory Array 106 through a serial interface. TCPU 103 accesses Memory Array 106 before the serial interface, thus avoiding the speed penalty incurred by the serial interface.

Figure 4:
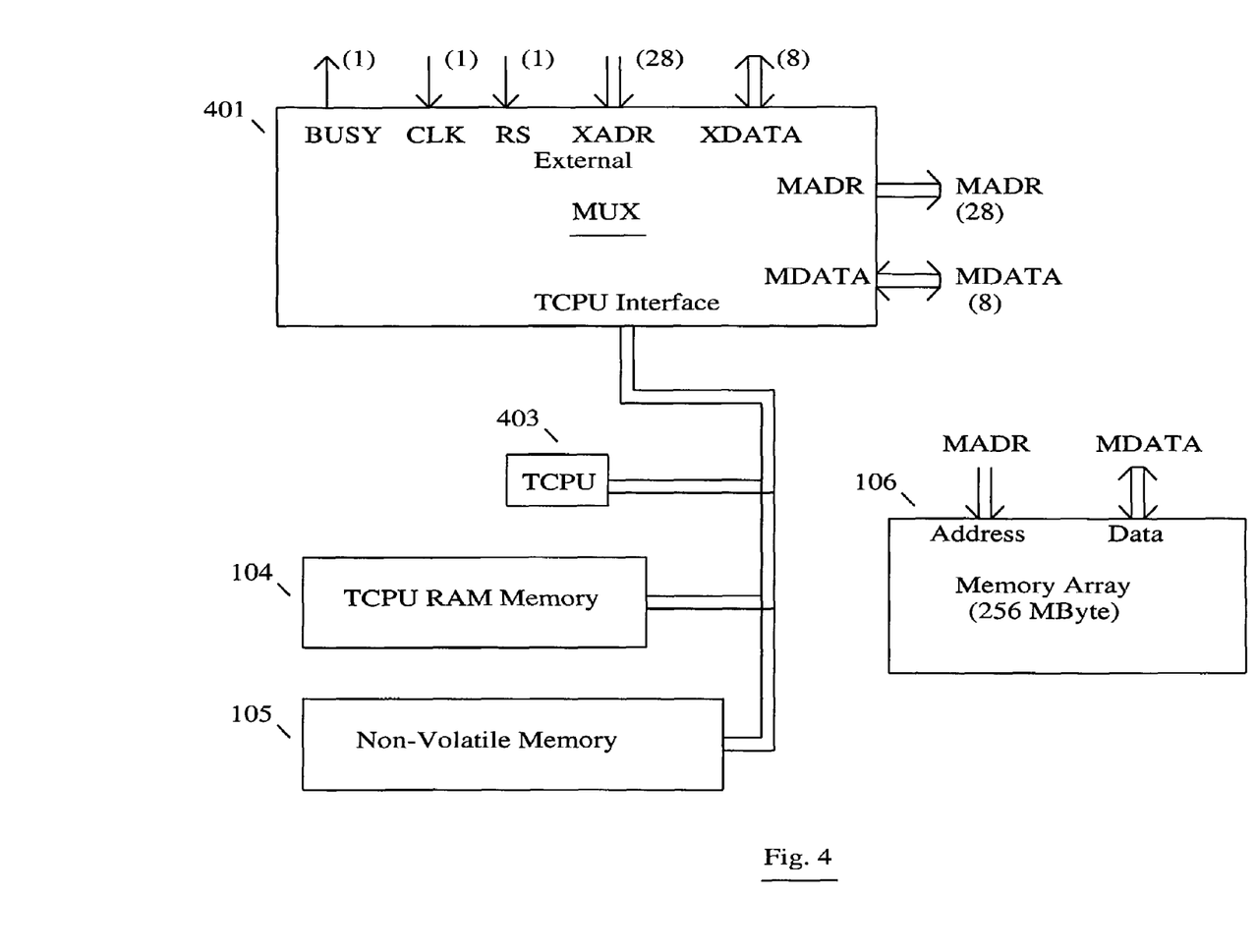
FIG. 4 shows the integrated processor system without a programmable clock in a memory with non-multiplexed address inputs.

FIG. 4 shows an embodiment that is identical to that shown in FIG. 1 except Programmable Clock 102 is omitted. This is for memories which are tested at only one speed during wafer testing. MUX 401 is similar to MUX 101 shown in FIG. 1 and provides external access to Memory Array 106 through a non-multiplexed address bus. TCPU 403 performs the same function as TCPU 103 but does not control a programmable clock.

Figure 5:
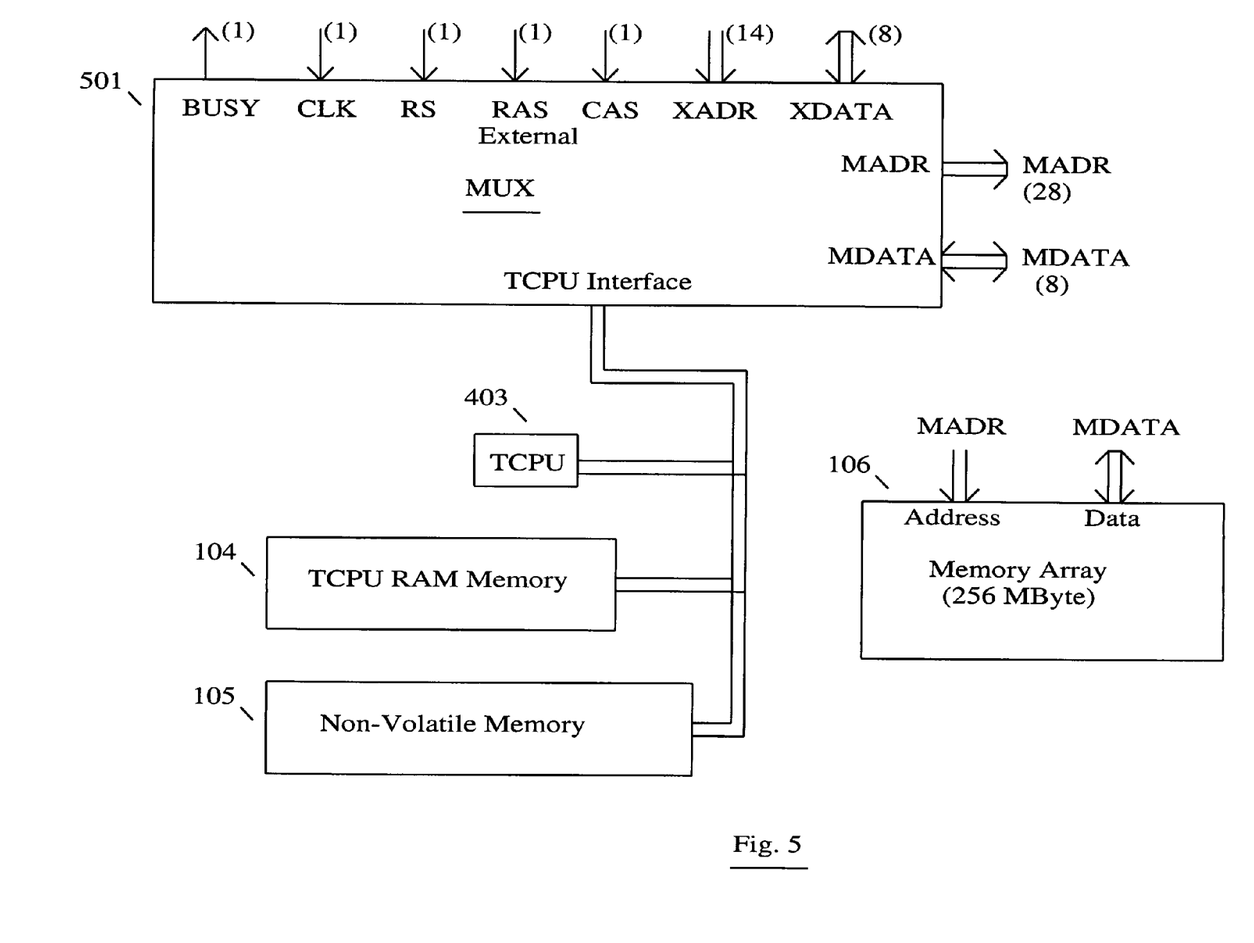
FIG. 5 shows the integrated processor system without a programmable clock in a memory with multiplexed address inputs.

FIG. 5 shows an embodiment that is identical to that shown in FIG. 4 except that MUX 501 provides external access to Memory Array 106 through a multiplexed address bus. TCPU 403 accesses Memory Array 106 before the addresses are multiplexed, thus avoiding the speed penalty incurred by multiplexing the address bus.

Figure 6:
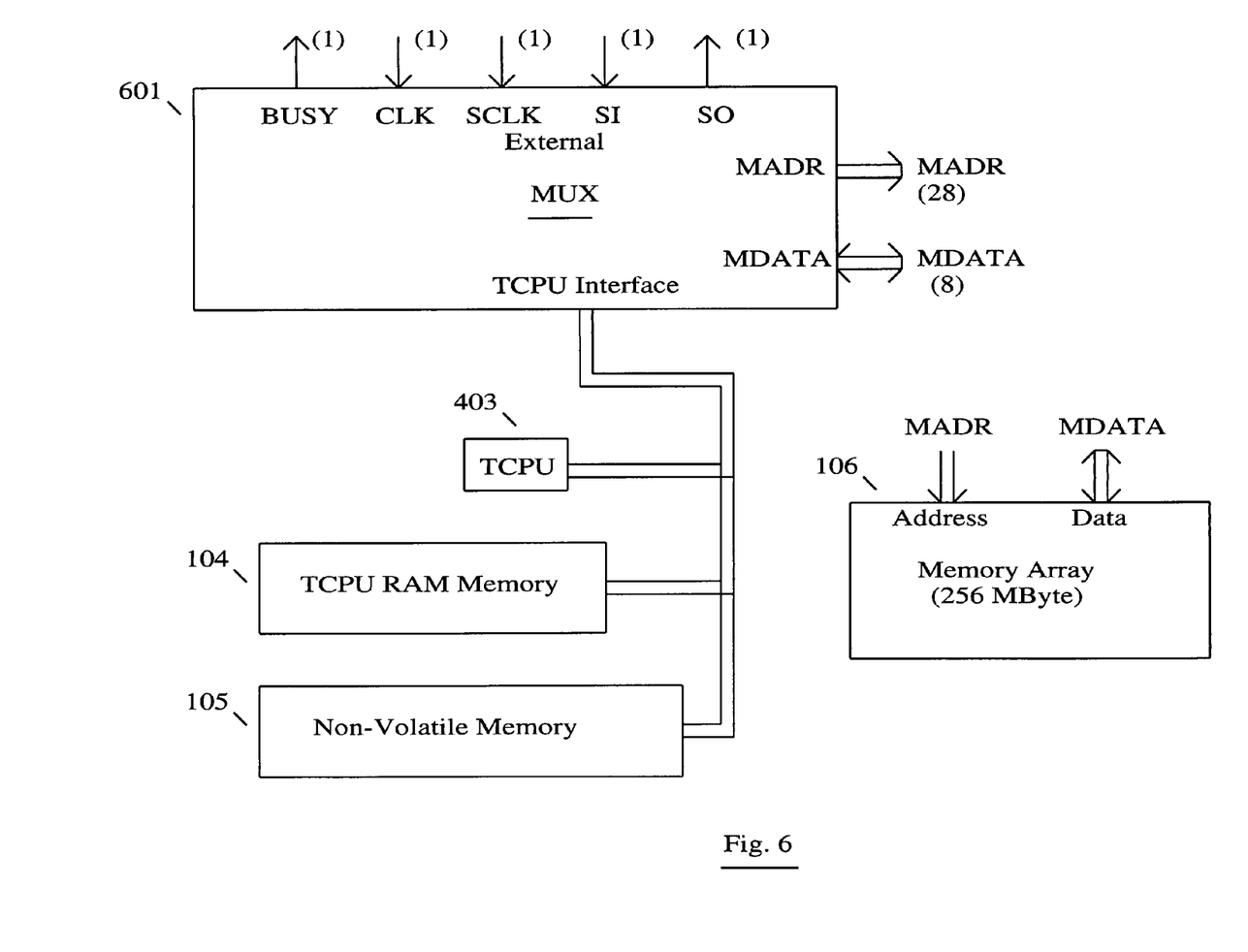
FIG. 6 shows the integrated processor system without a programmable clock in a memory with a serial interface.

FIG. 6 shows an embodiment that is identical to that shown in FIG. 4 except that MUX 601 provides external access to Memory Array 106 through a serial interface. TCPU 403 accesses Memory Array 106 before the serial interface, thus avoiding the speed penalty incurred by the serial interface.

An example of a test suite for testing pattern sensitivity is show in Table 1(a) through Table 1(k). They are intended to be performed in sequence. When testing Main Memory in systems using Cache Memory care must be taken to turn off the Cache Memory so that Main Memory is tested and not Cache Memory.

TABLE 1(a)

Set all memory locations to '0'
Start with address 0
Check that the data = $00
Turn on each bit (d0-d7); Check the byte for correct data
Increment the address and repeat for all memory addresses
The data pattern for each memory address is:
   (d7 d6 d5 d4 d3 d2 d1 d0)
   00000000
   00000001
   00000011
   00000111
   00001111
   00011111
   00111111
   01111111
   11111111
At the end of this test, all memory locations are set to '1'.

TABLE 1(b)

Start with address 0
Check that the data = $FF
Turn off each bit (d0-d7); Check the byte for correct data
Increment the address and repeat for all memory addresses
The data pattern for each memory address is:
   11111111
   11111110
   11111100
   11111000
   11110000
   11100000
   11000000
   10000000
   00000000
At the end of this test, all memory locations are set to '0'.

TABLE 1(c)

Start with highest memory address
Check that the data = $00
Turn on each bit (d7-d0); Check the byte for correct data
Decrement the address and repeat for all memory addresses
The data pattern for each memory address is:
   00000000
   10000000
   11000000
   11100000

TABLE 1(c)-continued 11110000
11111000
11111100
11111110
11111111
At the end of this test, all memory locations are set to '1'.

TABLE 1(d)

Start with highest memory address
Check that the data = $FF
Turn off each bit (d7-d0); Check the byte for correct data
Decrement the address and repeat for all memory addresses
The data pattern for each memory address is:
    11111111
    01111111
    00111111
    00011111
    00001111
    00000111
    00000011
    00000001
    00000000
At the end of this test, all memory locations are set to '0'.

TABLE 1(e)

Start with address 0
Check that the data = $00
Turn each bit (d7-d0) on, then off; Check the byte for correct data
Increment the address and repeat for all memory addresses
The data pattern for each memory address is:
    00000000
    10000000
    00000000
    01000000
    00000000
    00100000
    00000000
    00010000
    00000000
    00001000
    00000000
    00000100
    00000000
    00000010
    00000000
    00000001
    00000000
At the end of this test, all memory locations are set to '0'.

TABLE 1(f)

Start with highest address
Check that the data = $00
Turn each bit (d0-d7) on, then off; Check the byte for correct data
Decrement the address and repeat for all memory addresses
The data pattern for each memory address is:
    00000000
    00000001
    00000000
    00000010
    00000000
    00000100
    00000000
    00001000
    00000000
    00010000
    00000000
    00100000
    00000000
    01000000

TABLE 1(f)-continued

00000000
    10000000
    00000000
At the end of this test, all memory locations are set to '0'.

TABLE 1(g)

Set all memory locations to '1'
Start with highest memory address
Check that the data = $FF
Turn each bit (d7-d0) off, then on; Check the byte for correct data
Increment the address and repeat for all memory addresses
The data pattern for each memory address is:
    11111111
    01111111
    11111111
    10111111
    11111111
    11011111
    11111111
    11101111
    11111111
    11110111
    11111111
    11111011
    11111111
    11111101
    11111111
    11111110
    11111111
At the end of this test, all memory locations are set to '1'.

TABLE 1(h)

Start with highest memory address
Check that the data = $FF
Turn each bit (d0-d7) off, then on; Check the byte for correct data
Decrement the address and repeat for all memory addresses
The data pattern for each memory address is:
    11111111
    11111110
    11111111
    11111101
    11111111
    11111011
    11111111
    11110111
    11111111
    11101111
    11111111
    11011111
    11111111
    10111111
    11111111
    01111111
    11111111
At the end of this test, all memory locations are set to '1'.

TABLE 1(i)

Fill all memory addresses with $55
Start with address 0
Check that the data = $55
Write $AA to the address; Check the byte for correct data
Increment the address and repeat for all memory addresses
The data pattern for each memory address is:
    01010101
    10101010
At the end of this test, all memory addresses are set to $AA.

TABLE 1(j)

Start with address 0
Check that the data = $AA
Write $55 to the address; Check the byte for correct data
Increment the address and repeat for all memory addresses
The data pattern for each memory address is:
   10101010
   01010101
At the end of this test, all memory addresses are set to $55

TABLE 1(k)

Start with address 0
Use the Least Significant 8 bits of the address as data
Write the data to the memory address
Increment the address and repeat for all memory addresses
Start with address 0
Use the Least Significant 8 bits of the address as data
Check the data at the memory address
Increment the address and repeat for all memory addresses
The data pattern for the first 8 addresses is:
   00000000
   00000001
   00000010
   00000011
   00000100
   00000101
   00000110
   00000111

While preferred embodiments of the present invention have been shown, it is to be expressly understood that modifications and changes may be made thereto and that the present invention is set forth in the following claims.

I claim:

1. A single chip memory comprising:
(a) a memory array;
(b) a processor;
(c) a processor RAM memory;
(d) a multiplexor;
whereas:
(a) said processor is connected to said processor RAM memory and said multiplexor;
(b) said memory array is also connected to said multiplexor;
(c) said memory array is a read/write memory;
whereby:
(a) said multiplexor controls and arbitrates access between said memory array, said processor, said processor RAM memory, and a user's system;
(b) said user's system uses said multiplexor to store a program into said processor RAM memory;
(c) said processor uses said program in said processor RAM memory to test said memory array; and
whereas said program is an algorithmic test program.

2. The single chip memory of claim 1 further comprising a non-volatile memory connected to said processor, said processor RAM memory, and said multiplexor.

3. The single chip memory of claim 1 further comprising a programmable clock connected to said processor.

4. The single chip memory of claim 1 whereby said program is also used by said processor to perform one or more functions selected from a group comprising data pattern matching, moving data, graphics primitives, data encryption, and data decryption.

5. A single chip memory comprising:
(a) a memory array;
(b) a processor;
(c) a processor RAM memory;
(d) a multiplexor;
(e) a non-volatile memory;
whereas:
(a) said processor is connected to said processor RAM memory, said multiplexor, and said non-volatile memory;
(b) said memory away is also connected to said multiplexor;
(c) said memory away is a read/write memory;
whereby:
(a) said multiplexor controls and arbitrates access between said memory array, said processor, said processor RAM memory, said non-volatile memory, and a user's system;
(b) said user's system uses said multiplexor to store a program into said processor RAM memory;
(c) said processor uses said program in said processor RAM memory to test said memory array;
(d) said processor uses said non-volatile memory to store the results of said program in said processor RAM memory used to test said memory array; and
whereas said program is an algorithmic test program.

6. The single chip memory of claim 5 further comprising a programmable clock connected to said processor.

7. The single chip memory of claim 5 whereby said program is also used by said processor to perform one or more functions selected from a group comprising data pattern matching, moving data, graphics primitives, data encryption, and data decryption.

8. A single chip memory comprising:
(a) a memory array;
(b) a processor;
(c) a processor RAM memory;
(d) a multiplexor;
(e) a non-volatile memory;
(f) a programmable clock;
whereas:
(a) said processor is connected to said processor RAM memory, said multiplexor, and said non-volatile memory;
(b) said memory away is also connected to said multiplexor;
(c) said memory away is a read/write memory;
(d) said programmable clock is connected to said processor;
whereby:
(a) said multiplexor controls and arbitrates access between said memory array, said processor, said processor RAM memory, said non-volatile memory, and a user's system;
(b) said user's system uses said multiplexor to store a program into said processor RAM memory;
(c) said processor uses said program in said processor RAM memory to test said memory array;
(d) said processor uses said non-volatile memory to store the results of said program in said processor RAM memory used to test said memory array; and
whereas said program is an algorithmic test program.

* * * * *